(12) United States Patent
Kang et al.

(10) Patent No.: US 7,457,160 B2
(45) Date of Patent: Nov. 25, 2008

(54) METHODS OF APPLYING READ VOLTAGES IN NAND FLASH MEMORY ARRAYS

(75) Inventors: Hyung-seok Kang, Gyeonggi-do (KR);
Eui-gyu Han, Gyeonggi-do (KR);
Gyeong-soo Han, Gyeonggi-do (KR);
Jin-yub Lee, Gyeonggi-do (KR);
Hoo-sung Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 11/635,995

(22) Filed: Dec. 8, 2006

(65) Prior Publication Data
US 2008/0101122 A1  May 1, 2008

(30) Foreign Application Priority Data
Oct. 30, 2006  (KR) .................... 10-2006-0105816

(51) Int. Cl.
*G11C 11/34* (2006.01)
(52) U.S. Cl. .................. 365/185.17; 365/189.011; 365/185.01
(58) Field of Classification Search ............ 365/185.17, 365/189.011, 185.01
See application file for complete search history.

(56) References Cited

U.S. PATENT DOCUMENTS

| 3,737,833 | A | 6/1973 | Jerominek |
| 4,072,390 | A | 2/1978 | Fox |
| 5,299,956 | A | 4/1994 | Brownell et al. |
| 5,299,956 | A | 10/1995 | Brownell et al. |
| 6,292,406 | B1 * | 9/2001 | Le et al. ............... 365/189.09 |
| 2006/0139997 | A1 | 6/2006 | Park et al. |

FOREIGN PATENT DOCUMENTS

| KR | 100161410 | 8/1998 |
| KR | 1020020094502 | 12/2002 |
| KR | 1020060074179 | 7/2006 |

* cited by examiner

*Primary Examiner*—Richard Elms
*Assistant Examiner*—Nam Nguyen
(74) *Attorney, Agent, or Firm*—Myers Bigel Sibley & Sajovec, P.A.

(57) ABSTRACT

Provided is a method of improving the read disturb characteristics of a flash memory array. According to the method, in a flash memory array having at least one cell string in which a string selection transistor, a plurality of memory cells, and a ground selection transistor are connected in series, first read voltage is applied to a string selection line connected to a gate of the string selection transistor and a ground selection line connected to a gate of the ground selection transistor. Ground voltage is applied to a word line of a memory cell selected from among the memory cells. Second read voltage is applied to word lines of memory cells, from among the memory cells that are not selected, which are adjacent to the string selection transistor and the ground selection transistor. Then, the first read voltage is applied to the other memory cells that are not selected. The second read voltage is lower than the first read voltage.

10 Claims, 3 Drawing Sheets

METHODS OF APPLYING READ VOLTAGES IN NAND FLASH MEMORY ARRAYS

CROSS-REFERENCE TO RELATED PATENT APPLICATION

This application claims the priority of Korean Patent Application No. 10-2006-0105816, filed on Oct. 30, 2006, in the Korean Intellectual Property Office, the disclosure of which is incorporated herein in its entirety by reference.

FIELD OF THE INVENTION

The present invention relates to semiconductor memory devices, and more particularly, to methods of operating NAND type flash memory arrays.

BACKGROUND

A flash memory device, which is a nonvolatile semiconductor memory device, has been widely used in digital cameras, computers mobile telecommunication terminals memory cards, and so on. The flash memory device may be largely categorized into two types: a NOR type flash memory device and a NAND type flash memory device. The NOR type flash memory device is suitable for high-speed program and read operations but may not be suitable for high integration density, since contact holes are formed in source and drain regions of each cell transistor. The NAND type flash memory device may be suitable for high integration density since a plurality of cell transistors are connected in series to form a string.

FIG. 1 is a circuit diagram of a conventional NAND type flash memory array 100. Referring to FIG. 1, the memory cell array 100 includes a plurality of cell strings 110 that are connected to bit lines BL0 and BL1, respectively. Each of the cell strings 110 includes a string selection transistor SST, a ground selection transistor GST, and a plurality of memory cells MC0 through MCm that are connected in series between selection transistors GST and SST. The string selection transistor SST includes a drain connected to the bit line BL0 and a gate connected to a string selection line SSL. The ground selection transistor GST includes a source connected to a common source line CSL and a gate connected to a ground selection line GSL. The memory cells MC0 through MCm connected to word lines WL0 through WLm are connected in series between a source of the string selection transistor SST and a drain of the ground selection transistor GST.

A programming operation and a read operation performed on the NAND type flash memory array will be described. First, the memory cells MC0 through MCm of the memory cell array 100 are erased to have a threshold voltage of −1V, for example, before performing the programming operation thereon. Next, the selected memory cell MC1 is programmed to have a high threshold voltage by applying a high program voltage Vpgm, e.g., 18 through 20V, to the word line WL1 of the selected memory cell MC1, in order to program the memory cells MC0 through MCm. The threshold voltages of the other memory cells MC0, and MC2 through MCm that are not selected are constant.

FIG. 2 is a timing diagram of the read operation of the NAND type flash memory array 100 illustrated in FIG. 1. Referring to FIG. 2, in a bit line precharging section, the bit lines BL0 and BL1 are precharged to a precharge voltage, and 0 V is applied to the string selection line SSL, the ground selection line GSL, the common source line CSL, and all the word lines WL0 through WLm. In a reading section, 0V is applied to the word line WL1 of the selected memory cell MC1; and a read voltage Vread, for example, 4V to 5V, that is greater than the threshold voltages of programmed memory cells is applied to the word lines WL0 and WL2 through WLm of the memory cells MC0 and MC2 through MCm that are not selected, the string selection line SSL, and the ground selection line GSL. Thus, whether the memory cell MC1 is an "ON" cell or an "OFF" cell is determined depending on whether current flows through the cell string 110 of the selected memory cell MC1.

However, when the read operation is repeatedly performed, the read disturb characteristics of a memory cell can cause an "ON" cell to be perceived as being "OFF." That is, during the read operation, electrons may gradually be injected into a floating gate of a memory cell transistor, and thus, an "ON" memory cell may almost become an "OFF" memory cell, when the read voltage Vread is applied to a word line of an "ON" memory cell.

On a cross-section of the integrated cell string 110, as illustrated in FIG. 3, the string selection line SSL, the ground selection line GSL, and the word lines WL0 through WLm that are connected to the gates of the selection transistors SST and GST and the memory cells MC0 through MCm, are formed at predetermined intervals. Also, the memory cells MC0 through MCm have a coupling ratio of a capacitance Ctun determined by a tunneling oxide layer between a semiconductor substrate and floating gate to a capacitance $C_{ONO}$ determined by a dielectric layer between the floating gate and a control gate. The coupling ratio Cr is computed by:

$$Cr = \frac{C_{ONO}}{(C_{ONO} + C_{tun})} \qquad (1)$$

Since the selection transistors SST and GST have a different peripheral pattern from those of memory cells, and thus, a different patterning process is used to manufacture the selection transistors SST and GST. The distance d1 between the string selection line SSL and the adjacent word line WLm and between the ground selection line GSL and the adjacent word line WL0 is set to be longer than the distance d2 between the word lines WL0 through WLm, in consideration of the process patterning process.

Thus, the capacitances Ctun (which is determined by the tunneling oxide layer) of the memory cells MC0 and MCm adjacent to the selection transistors SST and GST can be less than the other memory cells MC1 through MCm-1, and thus, the memory cells MC0 and MCm may have a large coupling ratio. Accordingly, the memory cells MC0 and MCm may have degraded read disturbance characteristics, thereby lowering the reliability of the flash memory device.

SUMMARY

Embodiments according to the invention can provide methods of applying read voltages in nand flash memory arrays. In some embodiments according to the invention, a method of operating a flash memory array can include applying a ground voltage level to a word line of a selected memory cell selected for a read operation among the memory cell string and selectively applying, during the read operation, read voltage levels to word lines of unselected memory cells unselected for the read operation, wherein the read voltage levels vary based on positions of the unselected memory cells in the memory cell string.

BRIEF DESCRIPTION OF THE DRAWINGS

The above and other aspects and advantages of the present invention will become more apparent by describing in detail exemplary embodiments thereof with reference to the attached drawings in which.

DESCRIPTION OF EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
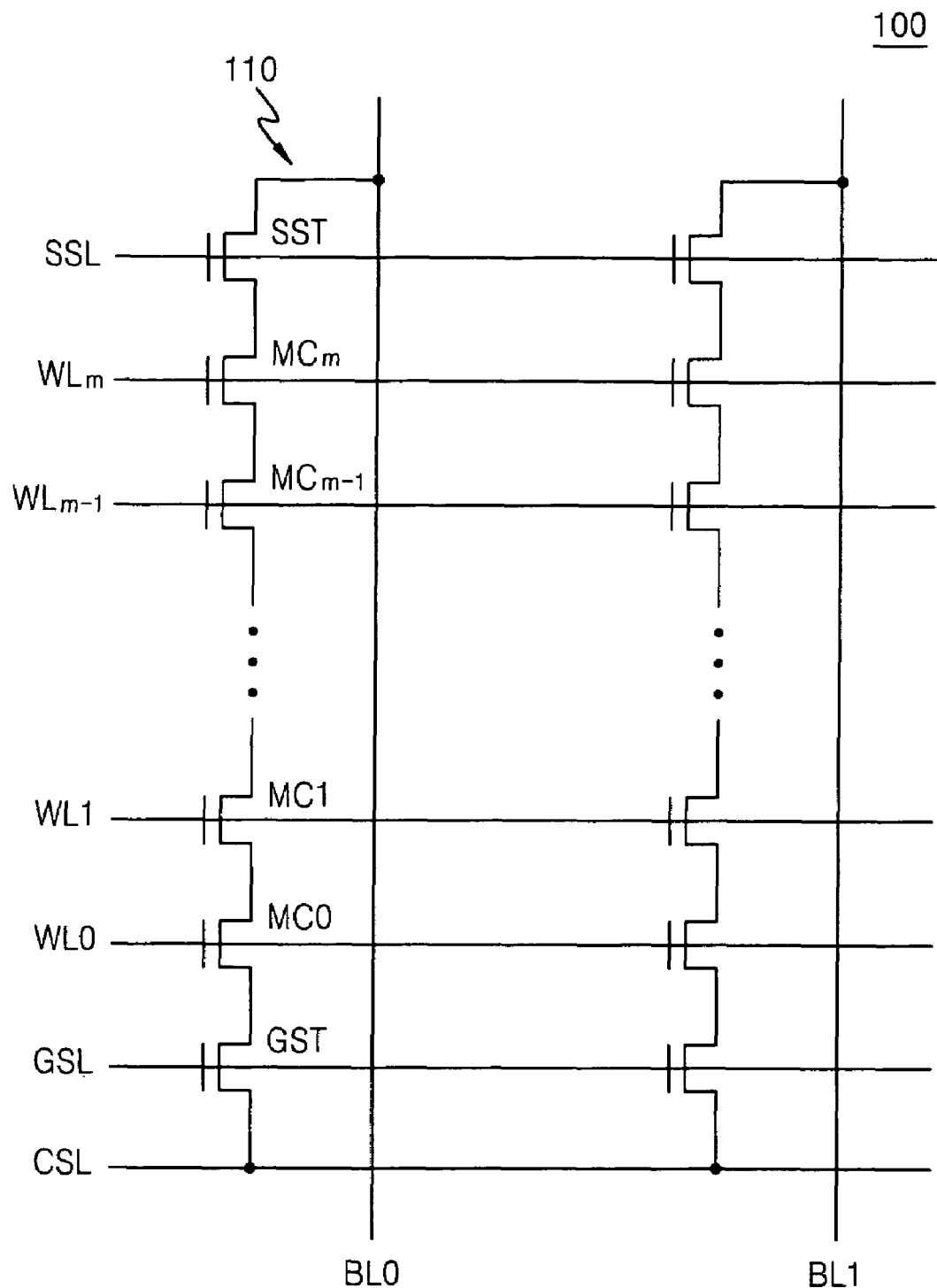
FIG. 1 is a circuit diagram of a conventional NAND type flash memory array.
Figure 2:
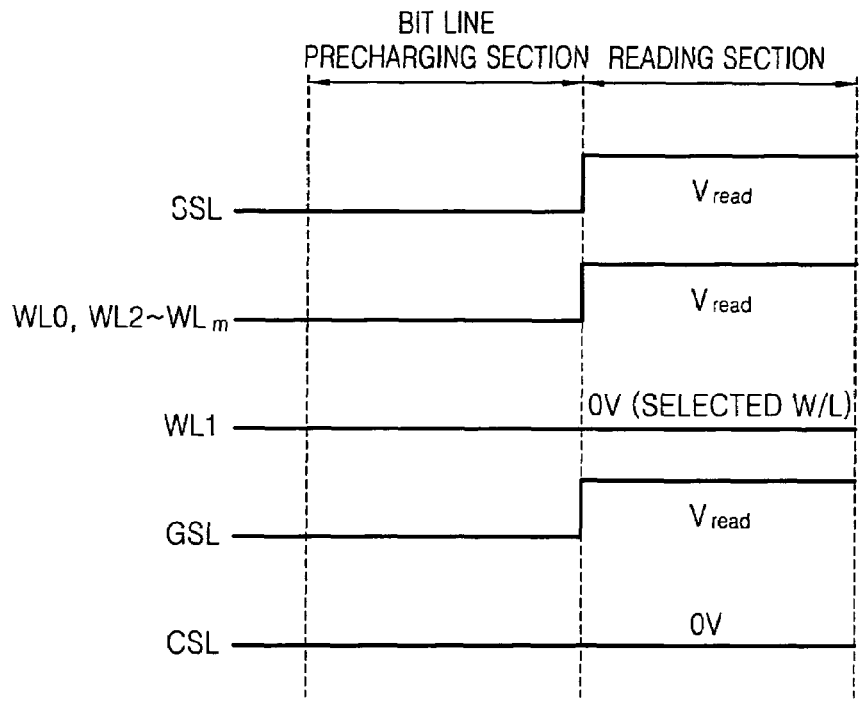
FIG. 2 is a timing diagram illustrating a method of reading information from the conventional NAND type flash memory array illustrated in FIG. 1.
Figure 3:
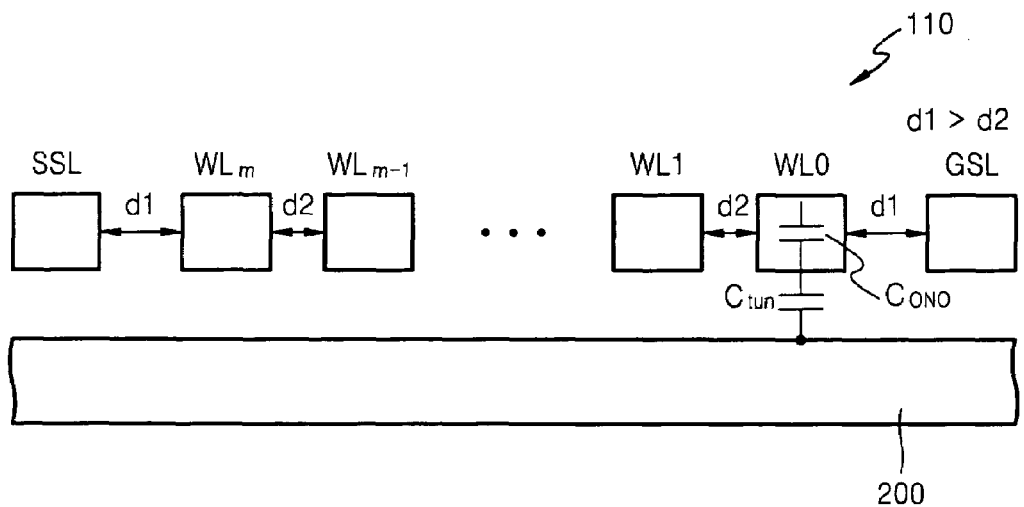
FIG. 3 is a cross-sectional view illustrating a method of manufacturing a cell string illustrated in FIG. 1.
Figure 4:
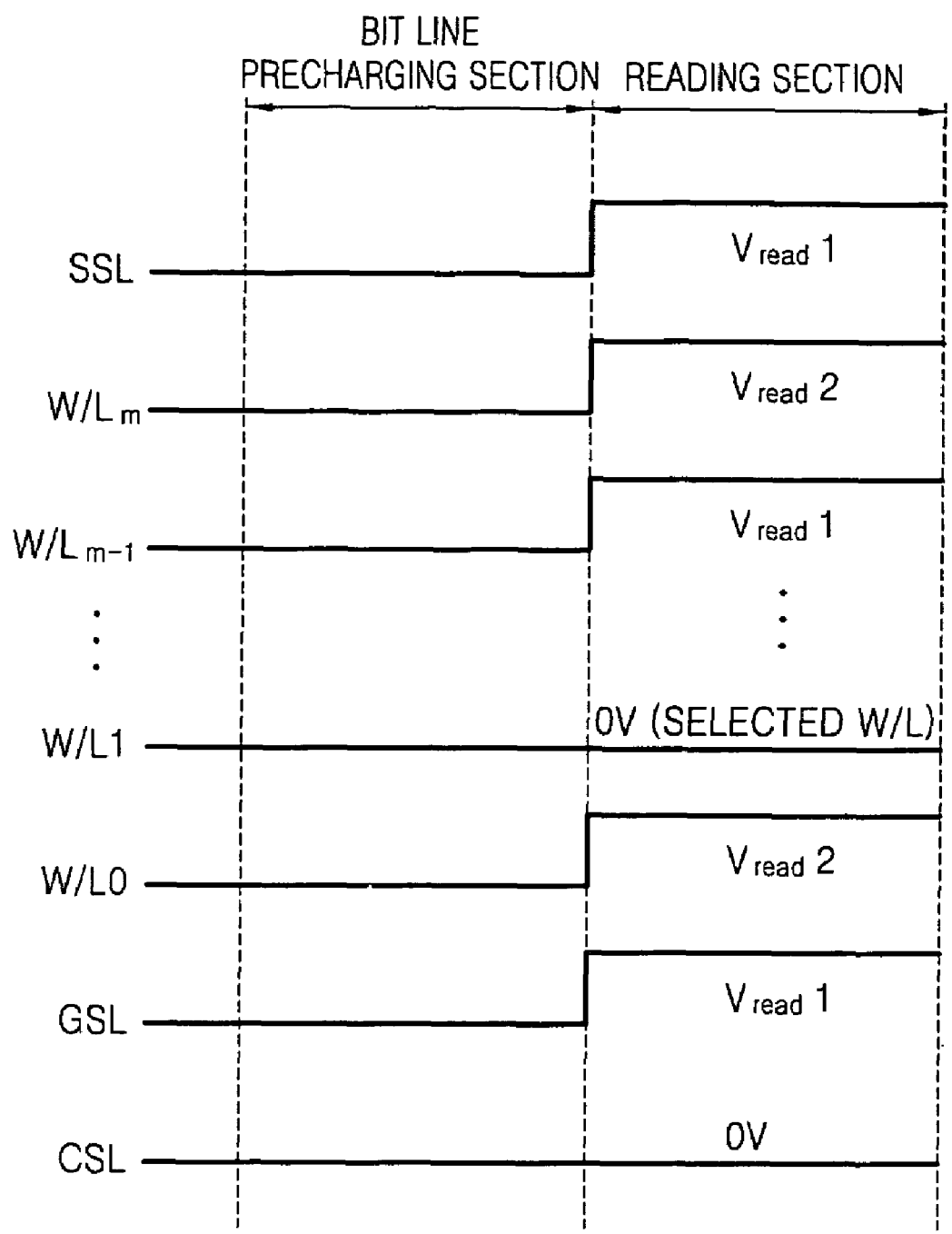
FIG. 4 is a timing diagram illustrating methods of reading information from a flash memory array in some embodiments according to the present invention.

FIG. 4 is a timing diagram illustrating a reading method of a flash memory array according to an embodiment of the present invention. A read operation performed on the selected memory cell MC1 of the memory cell array 100 illustrated in FIG. 1 will be described with reference to FIG. 4. In the bit line precharging section, 0 V is applied to the string selection line SSL, the ground selection line GSL, the common source line CSL, and all the word lines WL0 through WLm. In a reading section, the first read voltage Vread1 is applied to the string selection line SSL and the ground selection line GSL, and 0 V which is the ground voltage VSS is applied to the word line WL1 of the selected memory cell MC1. The second read voltage Vread is applied to the word lines WLm and WL0 of the memory cells MCm and MC0, from among the memory cells MC0 and MC2 through MCm that are not selected, which are adjacent to the string selection line SSL and the ground selection line GSL, and the first read voltage Vread1 is applied to the other memory cells MC2 through MCm-1.

The first and second read voltages Vread1 and Vread2 are greater than the threshold voltages of the programmed memory cells. The second read voltage Vread2 is lower than the first read voltage Vread1.

If the selected memory cell MC1 is an "ON" cell, the voltage of the precharged bit line BL0 is lowered by current flowing through the cell string 110. If the selected memory cell MC1 is an "OFF" cell, current does not flow through the cell string 10 and, thus, the voltage of the precharged bit line BL0 is maintained at a constant level.

The second read voltage Vread2 lower than the first read voltage Vread1 is applied to the word lines WLm and WL0 of the memory cells MCm and MC0, from among the memory cells MC0 and MC2 through MCm that are not selected, which are adjacent to the string selection transistor SST and the ground selection transistor GST, thereby preventing electrons from being injected into the floating gates of the memory cells MC0 and MCm having a large coupling ratio. Accordingly, it is possible to improve the read disturb characteristics of the memory cells MC0 and MCm.

While embodiments according to the invention has been particularly shown and described herein, it will be understood by those skilled in the art that various changes in form and details may be made therein without departing from the spirit and scope of the invention as defined by the appended claims.

What is claimed is:

1. A method of operating a flash memory array having at least one memory cell string in which a string selection transistor, a plurality of memory cells, and a ground selection transistor are connected in series with one another, the method comprising:

applying a ground voltage level to a word line of a selected memory cell selected for a read operation among the memory cell string; and selectively applying, during the read operation, read voltage levels to word lines of unselected memory cells unselected for the read operation, wherein the read voltage levels vary based on positions of the unselected memory cells in the memory cell string.

2. The method of claim 1, wherein a first read voltage level applied to the word lines of the unselected memory cells immediately adjacent to the string selection transistor and to the ground selection transistor in the memory cell string, is less than a second read voltage level applied to word lines of remaining ones of the unselected memory cells.

3. The method of claim 2, wherein a distance between a gate of an unselected memory cell transistor adjacent to the string selection transistor and a gate of the string selection transistor is greater than a distance between gates of the memory cell transistors in the memory cell string.

4. The method of claim 2, wherein a distance between a gate of the unselected memory cell transistor adjacent to the ground selection transistor and a gate of the ground selection transistor is greater than a distance between the gates of the memory cell transistors in the memory cell string.

5. A method of operating a flash memory array having at least one memory cell string in which a string selection transistor, a plurality of memory cells, and a ground selection transistor are connected in series with one another, the method comprising:

applying a ground voltage level to a word line of a memory cell selected from among memory cell string for a read operation;

selectively applying a first read voltage level to word lines of unselected memory cells within the memory cell string that are immediately adjacent to the string selection transistor and to the ground selection transistor; and selectively applying second read voltage level to a string selection line connected to a gate of the string selection transistor and a ground selection line connected to a gate of the ground selection transistor.

6. The method of claim 5, wherein a distance between a gate of a memory cell transistor adjacent to the string selection transistor and a gate of the string selection transistor is greater than a distance between the gates of the memory cell transistors located between the string selection transistor and the ground selection transistor.

7. The method of claim 5, wherein a distance between a gate of a memory cell transistor immediately adjacent to the ground selection transistor and a gate of the ground selection transistor is greater than a distance between the gates of the memory cell transistors located between the string selection transistor and the ground selection transistor.

8. The method of claim 5, wherein the second read voltage is less than the first read voltage.

9. The method of claim 5, wherein selectively applying a first read voltage to the string selection line and the ground selection line is performed before applying the corresponding read voltages to the word lines of the memory cells.

10. The method of claim 5, wherein before the read operation the method further comprises precharging a bit line connected to the memory cell string to a precharge voltage level.

* * * * *